United States Patent [19]

Roemer et al.

[11] Patent Number: 4,871,969
[45] Date of Patent: Oct. 3, 1989

[54] RF SHIELD FOR RF COIL CONTAINED WITHIN GRADIENT COILS OF NMR IMAGING DEVICE

[75] Inventors: Peter B. Roemer; William A. Edelstein, both of Schenectady, N.Y.

[73] Assignee: General Electric Company, Schenectady, N.Y.

[21] Appl. No.: 288,605

[22] Filed: Dec. 22, 1988

[51] Int. Cl.[4] ............................................. G01R 33/20
[52] U.S. Cl. ....................................... 324/318; 324/300
[58] Field of Search ............... 324/300, 318, 319, 320; 335/214, 301; 336/84 R, 84 C

[56] References Cited

U.S. PATENT DOCUMENTS

| 4,638,253 | 1/1987 | Jaskolski et al. | 324/318 |
| 4,642,569 | 2/1987 | Hayes et al. | 324/318 |
| 4,733,189 | 3/1988 | Punchard et al. | 324/318 |

Primary Examiner—Stewart J. Levy
Assistant Examiner—Kevin D. O'Shea
Attorney, Agent, or Firm—Geoffrey H. Krauss; James C. Davis, Jr.; Marvin Snyder

[57] ABSTRACT

An RF shield, for use between a set of gradient coils and an RF coil, is hollow formed of a single conductor sheet divided into first and second opposed halves, each having a set of conductive streamline portions with a series of nonconductive cut lines formed therebetween. Each of the cut lines is parallel to the RF current and is of a generally oval shape. Each of the shield conductor loops is further separated into a "C"-shaped conductive portion, along at least one radial line, and the C portions are then connected so as to continue shielding the RF current, yet pass gradient magnetic fields in all three mutually orthogonal directions of a Cartesian coordinate system.

12 Claims, 6 Drawing Sheets

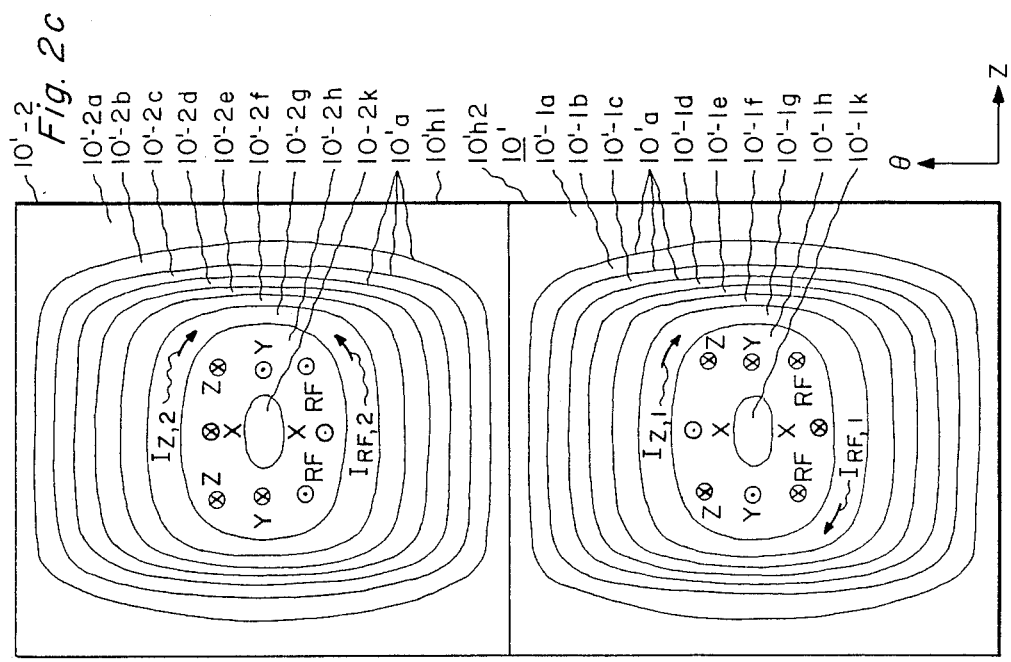
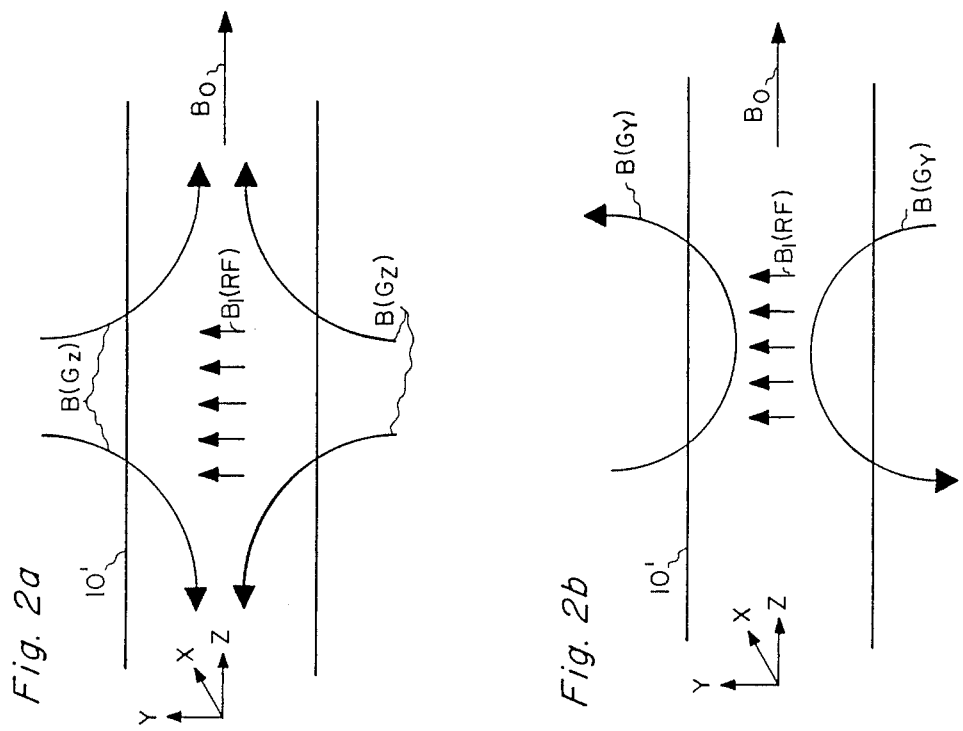

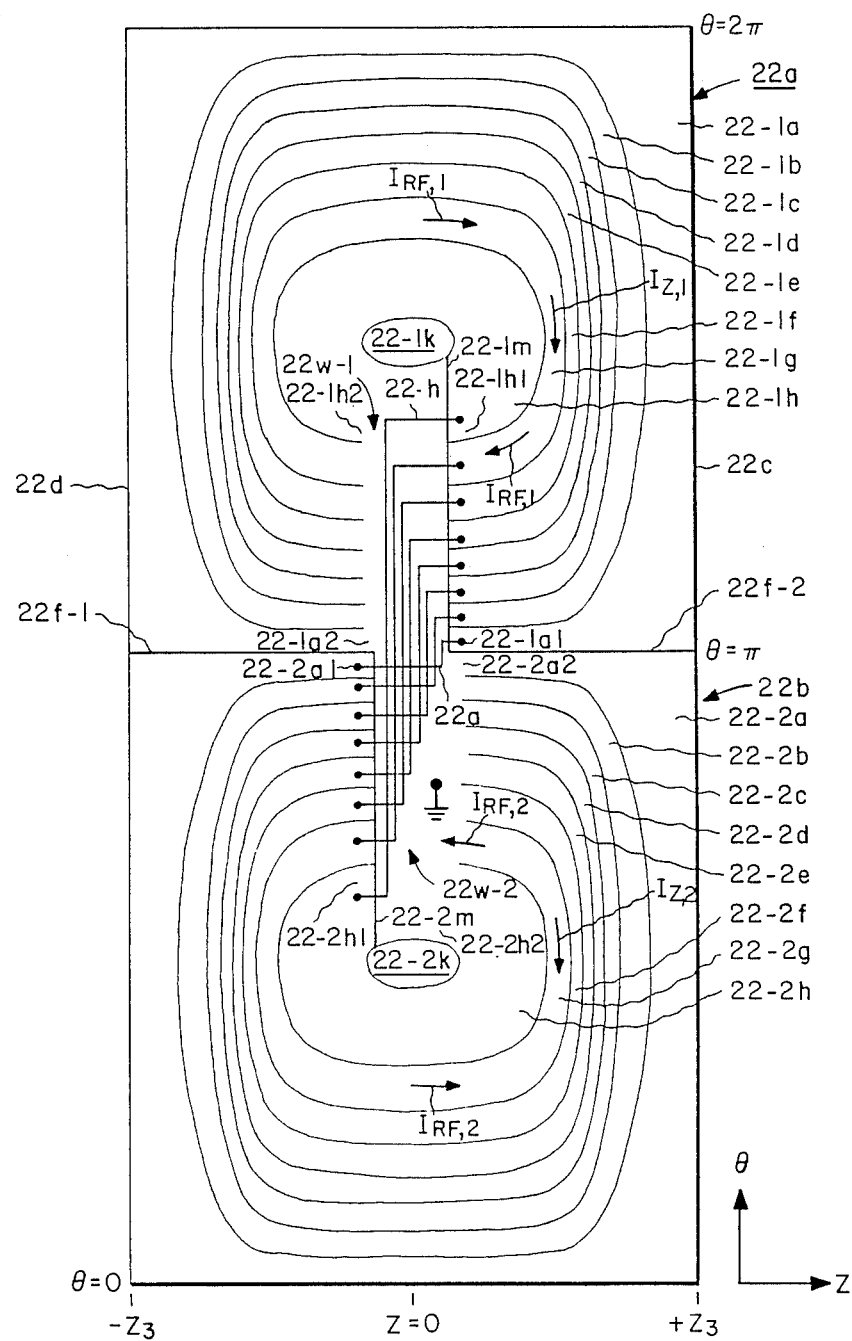

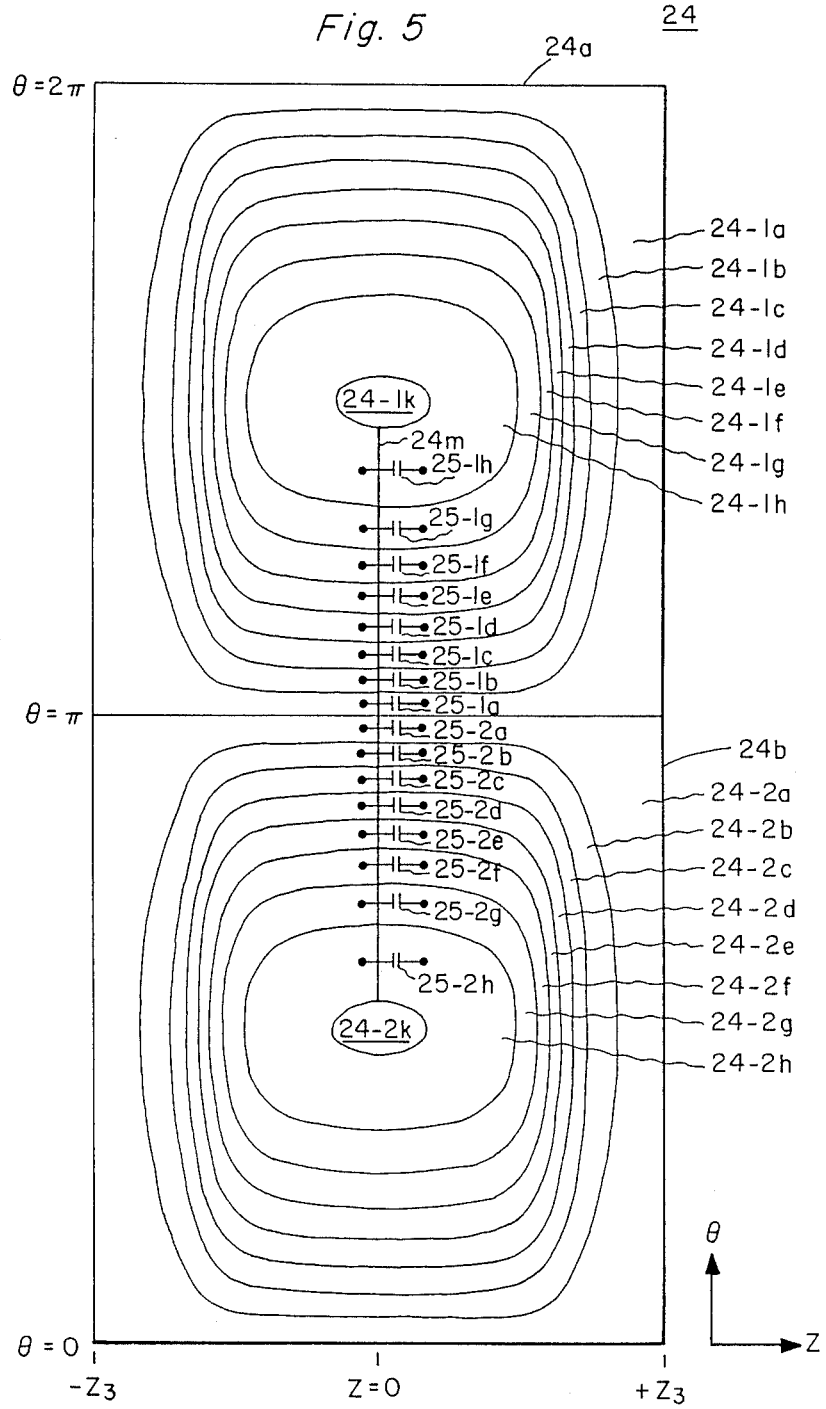

RF SHIELD FOR RF COIL CONTAINED WITHIN GRADIENT COILS OF NMR IMAGING DEVICE

BACKGROUND OF THE INVENTION

The present invention relates to radio-frequency (RF) shields and, more particularly, to a novel RF shield for placement between an RF body coil and a set of gradient coils in a nuclear-magnetic resonance (NMR) imaging device.

An NMR imaging device typically utilizes a set of three gradient coils to obtain spatially-selective information. Each of the three gradient coils generally contains a plurality of turns of conductive cable or wire, with integrated lengths of up to several hundred meters. RF fields lose a significant portion of their energy if these fields impinge upon the conductive wires of the gradient coils; while the loss mechanism is not fully understood, it is probably associated with resonances, exciting the gradient structure, having high currents and therefore associated high losses. Any RF power loss, in the gradient coils or otherwise, appears as a lowering of the quality factor Q of the RF coil and consequently appears as a lowering of the signal-to-noise ratio (SNR) attainable in the imaging device. Accordingly, it is highly desirable to prevent penetration of the RF field into the gradient coils; a shield is typically placed between the RF coil and the gradient coils. The RF shield must, however, be substantially transparent to the gradient magnetic fields and therefore must prevent inducement of any significant shield currents at gradient frequencies (typically less than about 10 KHz.) to prevent temporally-dependent and/or spatially-dependent magnetic field inhomogeneities from appearing and having an adverse affect on the resulting image.

Hitherto, RF shields for NMR imaging devices have used a copper-dielectric-copper laminate with an overlapping patchwork pattern etched into the copper sheets on both sides of the laminate. The patchwork patterns have generally been poor approximations to the current paths in a solid shield, so that induced currents are forced to flow through the shield dielectric at several locations. Thus, the current path contains the equivalent of several capacitors in series, and, undesirably, total path capacitance is relatively small. It is desirable to not only provide a highly effective RF shield for placement between an RF coil and a set of gradients coils, but also to provide such an RF coil in which the shield current flows through at most a single shield capacitor. It is also desirable to reduce the cost of an RF shield by removing the necessity for a conductor-dielectric-conductor laminate and utilizing a single conductive sheet.

BRIEF DESCRIPTION OF THE INVENTION

In accordance with the invention, an RF shield, for use between a generally cylindrical set of gradient coils and a generally cylindrical RF coil, is a hollow cylindrical conductor divided into first and second opposed half-cylinders, each having a plurality of conductive streamline portions having a series of nonconductive cut lines, formed therebetween, with each of the cut lines being parallel to the RF current and of a generally oval shape. Each of the shield conductor loops is separated into a generally "C"-shaped conductive portion along at least one "radial" line cut in each half-cylinder. The C portions are then connected so as to continue shielding the RF current, yet pass gradient magnetic fields in all three mutually orthogonal directions of a Cartesian coordinate system.

In presently preferred embodiments, each half of the single conductive sheet of the RF shield is radially cut along a single line which is symmetrical or juxtaposed with respect to the one cut line in the other shield half.

Accordingly, it is an object of the present invention to provide a novel RF shield for placement between an RF body coil and a gradient coil set in a NMR imaging device.

This and other objects of the present invention will become apparent reading the following detailed description, when considered in conjunction with the drawing.

BRIEF SUMMARY OF THE DRAWINGS

FIGS. 2a and 2b are illustrations of the relative directions of RF and gradient magnetic fields intercepted by the cylindrical RF shield of the present invention;

FIG. 2c is a graphical illustration of the shield current contours, and of the RF and gradient magnetic fields traversing the shield cylinder;

FIG. 4 is a plan view of another embodiment in which a common electrical point is utilized to reduce the number of shield contour portion interconnections; and FIG. 5 is a plan view of an RF shield, in accordance with the principles of the present invention, utilizing a single capacitor for reconnection of cut inducedcurrent contour portions.

DETAILED DESCRIPTION OF THE INVENTION

Figure 1:
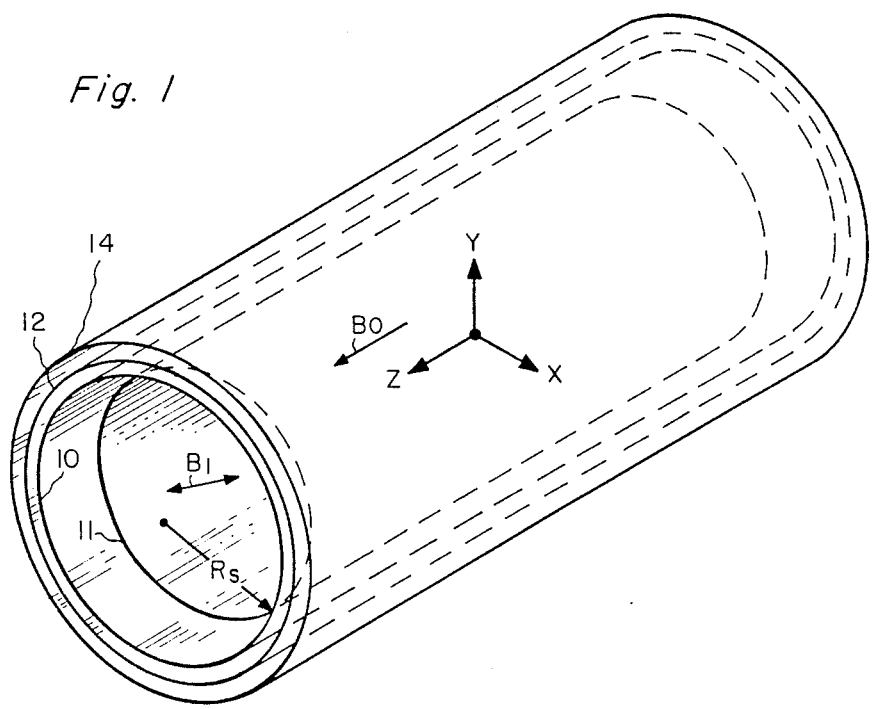
FIG. 1 is a perspective view of an RF whole body coil, gradient coil set and RF shield of the present invention, within the bore of a NMR imaging device magnet.

Referring initially to FIG. 1, a radio-frequency (RF) shield 10, in accordance with the present invention is a hollow cylindrical conductive member situated between a RF whole body coil 11 and a set of magnetic field gradient coils 12, within the bore 14 of a magnet (not shown) in a nuclear magnetic resonance (NMR) imaging device. By convention, the static main magnetic field $B_0$ of the main NMR system magnet (produced by the magnetic means formed about bore 14) is aligned with the Z axis of a Cartesian coordinate system. The RF coil 11 forms an RF magnetic field $B_1$, within the coil 11 bore responsive to a RF signal The NMR significant part of the $B_1$ field is transverse to field $B_0$ and therefore is typically in the X-Y plane. A significant RF magnetic field is also present outside of coil 11, and, as is well known in the art, will impinge upon gradient coils 12 unless the RF shield 10 is present and effectively operates as an RF short circuit. Shield 10 must be substantially transparent to the magnetic fields from gradient coils 12, allowing those gradient magnetic fields to enter into the bore of RF coil 11 and place spatial-encoding information upon the volume therein.

Figure 1A:
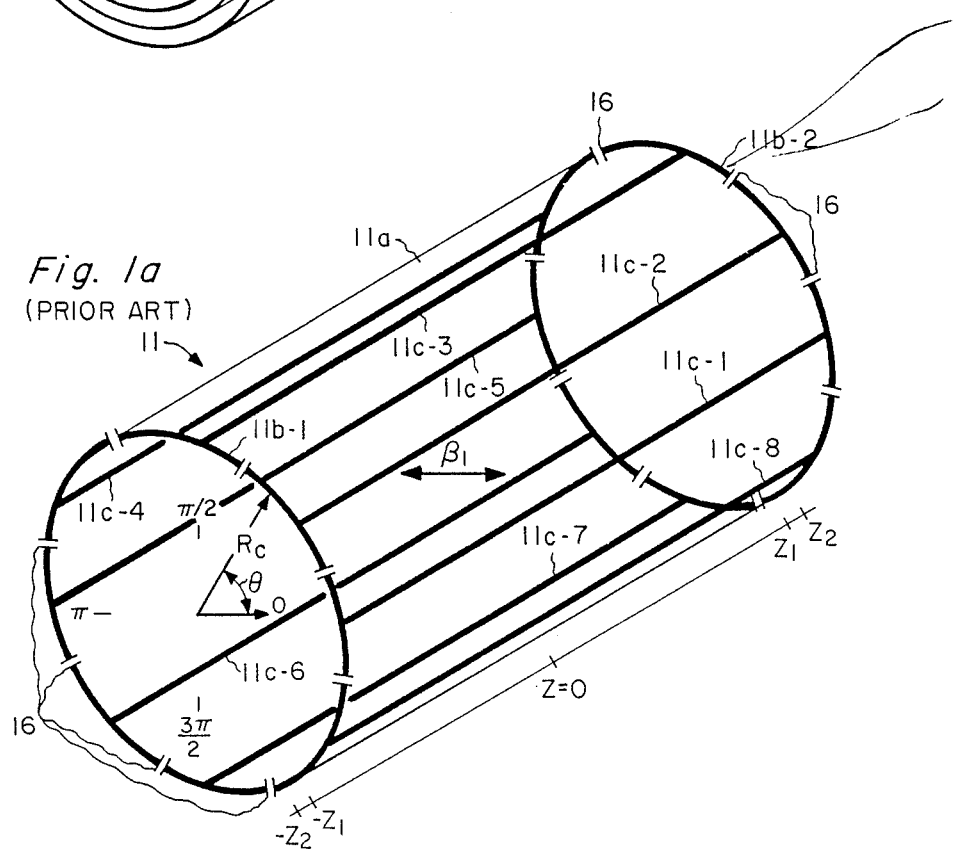
FIG. 1a is a schematic perspective view of one form of known whole body RF coil, and useful in appreciating the present invention.
Figure 1B:
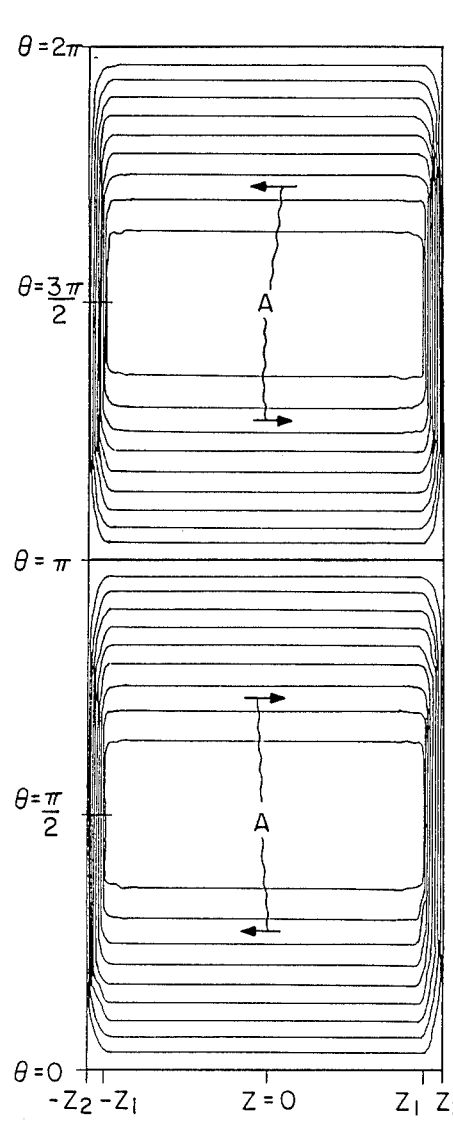
FIG. 1b is a graphic illustration of the current distribution contours in the RF coil of FIG. 1a, and useful in appreciating aspects of the present invention.

A typical whole body RF coil 11 is shown in FIG. 1a; this high-pass "birdcage" coil, formed upon a cylindrical base 11a of insulative material, comprises first and second spaced-apart end rings 11b-1 and 11b-2, each having a plurality of conductive segments (here, 8 segments) joined to one another by capacitive elements 16. Each of the end rings 11b is thus substantially in the X-Y plane, as is the $B_1$ RF field produced. A like number of axial conductors 11c (here, eight conductors 11c-1 through 11c-8) are used. Each conductor extends in the Z direction between one of the conductive segments of first end ring 11b-1 and a like-positioned position conductive segment of the second conductive end ring 11b-2. Thus, a first elongated conductive element 11c-1 is positioned at an angle $\theta = 0$ and each of the remaining seven elongated conductive members 11c-2 through 11c-8 are placed at successively greater angles around the periphery. Because of the cylindrical symmetry of the antenna coil, the RF magnetic fields and currents are analyzed utilizing cylindrical coordinates, of the form R, $\theta$, Z, where $\theta$ is the angle of revolution with respect to that plane formed through the Z axis and the first conductive member 11c-1. The axial center of coil 11 is placed at the Z=0 coordinate, and it is assumed that the birdcage coil currents are confined to a very thin layer and tend to flow through the areas of the end rings, defined by inner end ring dimension $Z_1$ and outer end ring dimension $Z_2$. For purposes of calculation, the appropriate coil distribution contours, parallel to the lines of current flow, are shown in FIG. 1b, for an unwrapped coil laid flat and having a single excited mode. The separations between contours are equally spaced in current, and the current flow in the direction of arrows A.

Figure 1C:
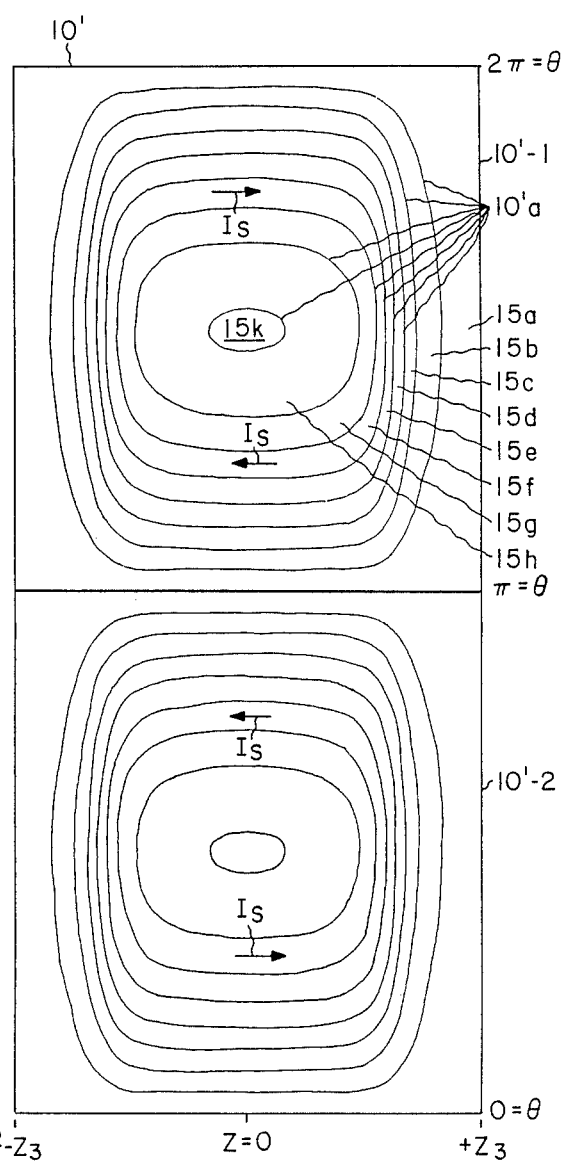
FIG. 1c is a graphical illustration of the shield currents flowing in a RF shield in accordance with the principles of the principle invention.

Referring now to FIG. 1c, we determine the shield currents $I_s$ by first calculating the RF magnetic currents flowing in a solid conductive shield member 10' which has been unwrapped as shown. It will be seen that the Z dimension of the shield extends from $-Z_3$ to $+Z_3$, where the total shield length $2Z_3$ is greater than the RF coil total length $2Z_2$. The circumferential width of the RF shield in the orthogonal ("$\theta$") dimension is greater than the associated width of the unwrapped RF coil (as shown in FIG. 1b) due to the greater radius $R_s$ of the shield cylinder, with respect to the radius $R_c$ of the coil 11 cylinder. Since the RF coil currents are assumed to be confined to a very thin layer, we can then Fourier decompose these currents and match them to the separable solutions of the Laplace equations, in cylindrical coordinates, for the RF shield sheet 10' and obtain expressions for the RF magnetic fields. With only a single mode excited in the RF coil 11, the resonant frequency current is substantially a sinusoidal distribution in the axial bars and thus produces a highly uniform magnetic field $B_1$ in the central RF coil volume. The RF coil 11 surface current densities $J_j$ are approximately given by $$J_\theta(\theta,z) = \frac{I}{Z_2 - Z_1} \cdot \begin{cases} 0 & |z| < Z_1 \\ -\sin\theta & Z_1 < z < Z_2 \\ \sin\theta & -Z_2 < z < -Z_1 \\ 0 & |z| > Z_2 \end{cases} \quad (1)$$

$$J_z(\theta,z) = \frac{I}{R_c(Z_2 - Z_1)} \cdot \begin{cases} -(Z_2 - Z_1)\cos\theta & |z| < Z_1 \\ -(Z_2 - |z|)\cos\theta & Z_1 < |z| < Z_2 \\ 0 & |z| > Z_2 \end{cases} \quad (2)$$

Proceeding with the determination of the RF coil surface current densities J, the central section of the coil has sinusoidal current densities which flow in the axial direction and are matched to currents in the end rings, so as to be divergence-free at the interface therebetween. The angular components of the end ring currents are assumed to be uniform in the Z direction and at a maximum value when the end rings carry a total current I. Instead of manipulating both components of the surface current, we express the surface currents in terms of a stream function $S(\theta,z)$, which is related to the surface current by $$J_\theta(\theta,z) = \frac{\partial}{\partial z} S(\theta,z) \quad (3)$$

$$J_z(\theta,z) = \frac{-1}{r} \frac{\partial}{\partial \theta} S(\theta,z) \quad (4)$$

By expressing the surface currents in terms of a stream function, the zero divergence of each surface current is guaranteed. The practical aspect of utilizing a stream function is that lines of constant stream S are contours formed parallel to the current flow. The RF shield current flow patterns are determined utilizing this parallel contour rule. Fourier decomposition of the currents in equations (1) and (2) results in the following birdcage coil stream function $$S_c(\theta,z) = \int_0^\infty A(k)\sin\theta\cos(kz)dk \quad (5)$$

where A(k) is given by the function $$A(k) = \frac{2I(\cos(kZ_1) - \cos(kZ_2))}{\pi k^2(Z_2 - Z_1)} \quad (6)$$

Matching these currents to the separable solutions of Laplace's equation, in cylindrical coordinates, yields the following result for the interior and exterior magnetic scalar potentials $\Phi$ $$\Phi(r,\theta,z) = \begin{cases} \int_0^\infty A(k) \, kR_c K_1'(kR_c) \, I_1(kr)\sin\theta\cos(kz)dk & r < R_c \\ \int_0^\infty A(k) \, kR_c I_1'(kR_c) \, K_1(kr)\sin\theta\cos(kz)dk & r > R_c \end{cases} \quad (7)$$

where $I_1$ and $K_1$ are modified Bessel functions respectively of the first and second kind. The magnetic flux density B, in terms of the scalar potential $\Phi$, is given by $$B = -\mu_0 \nabla \Phi \quad (8)$$

Placement of the RF coil 11 in a solid conductive shield 10 must result in zero external field. By superposition, this corresponds to currents, flowing on the inner surface of the shield, whose streamlines $S_s$ are given by the shield streamline function $S_s(\theta,z)$, which is $$S_s(\theta,z) = -\int_0^\infty A(k) \frac{R_c I_1'(kR_c)}{R_s I_1'(kR_s)} \sin\theta \cos(kz) dk \quad (9)$$

Contours of constant $S_s$ are parallel to the RF currents induced in the shield and the difference in value of two contours is numerically equal to the current flowing between them. FIG. 1c is a plot of the contours of equation (9), for equally spaced contours. In any RF shield 10′, conductive material is removed from areas where lines 10′a have been drawn and leave most of the conductor (e.g. copper) in place in the streamline contour portions 15 between the separating lines; by making nonconductive lines 10′a very thin, the RF shield currents $I_s$ are essentially unchanged in each half-cylinder 10′-1 and 10′-2 and a proper RF shield is provided. However, any currents which were induced, as by the gradient magnetic fields, to flow perpendicular to cuts 10a will no longer flow.

Differences are observable between the RF coil stream function $S_c$ of equation (5) and the RF shield stream function $S_s$ of equation (9); it is immediately evident that the signs of the stream functions are opposite, indicating that the shield currents are directionally opposite to the RF coil currents. If the shield radius $R_s$ is reduced toward $R_c$, so that the shield is brought closer to RF coil 11, the shield current strength and shape approach the RF coil current strength and shape. Conversely, if the shield radius $R_s$ is increased and the shield is moved away from the RF coil, the behavior of the Bessel functions ($I_1'(kr)$) are such that the larger values of k are preferentially attenuated and, since large values of k correspond to the short spatial wavelengths, the current pattern in the RF shield is an image of the RF coil which has been passed through a filter to remove the high spatial frequencies.

Referring now to FIGS. 2a and 2b, the Z-direction field $B(G_z)$ and Y-direction field $B(G_Y)$ are shown, with respect to the midplane of cylindrical shield 10′. The X-direction field $B(G_x)$, while not shown, is directed into and out of the plane of the drawing and has a shape substantially the same as, but orthogonal to, the Y-direction field in FIG. 2b. The RF magnetic field and the three gradient fields all have different field symmetries (i.e. are all orthogonal). The X and Y direction gradients $G_X$ and $G_Y$ will pass through contour-cut shield 10′ substantially without attenuation, although the Z-direction gradient $G_Z$ is attenuated to some degree. The field symmetries of the RF and gradient coils are tabulated in the following table:

| COIL | ANGULAR SYMMETRY OF RADIAL MAGNETIC FIELD ($\theta$ dependence) | AXIAL SYMMETRY OF RADIAL MAGNETIC FIELD (Z dependence) |
| --- | --- | --- |
| X gradient | Cos $\theta$ | ODD |
| Y gradient | Sin $\theta$ | ODD |
| Z gradient | Constant | EVEN |
| RF mode 1 | Sin $\theta$ | EVEN |
| RF mode 2 | Cos $\theta$ | EVEN |

Referring to FIG. 2c, the streamline-cut coppersheet shield 10′ has the various RF and gradient fields passing therethrough as shown. The "arrowpoint"-dot/"arrowtail"-cross convention is used to show the direction in which the field comes and goes. It will be seen that, in each shield half-cylinder 10′h1 or 10′h2 there is no net flux from either the X-gradient $G_X$ or the Y-gradient $G_Y$, as each of these gradients pass in both directions through each of the conducting stream line portions 10′-1a through 10′-1h and 10′-1k or 10′-2a through 10′-2h and 10′-2k and are effective self-cancelling. Therefore, the X and Y gradients $G_X G_Y$ do not induce any shield currents $I_s$. As will be seen from FIGS. 2a and 2c, the Z gradient $G_Z$ passes twice through each shield half-cylinder, but both passes are in the same direction; there is no self-cancellation but rather an additive effect and gradient $G_Z$ does link net flux with the shield loops and will produce shield current $I_Z$ components, as shown. Thus, the Z gradient-induced shield currents $I_{Z,1}$ and $I_{Z,2}$ flow in the same direction, such that the field produced by the Z gradient $G_Z$ reverses direction from the top half-cylinder 10′h1 to the bottom half-cylinder 10′h2. It will also be seen that non-cancelling RF field-induced currents $I_{RF,1}$ and $I_{RF,2}$ are induced and flow in opposite directions, as the RF gradient field $B_1$ does not reverse its direction across the cylinder.

Figure 3:
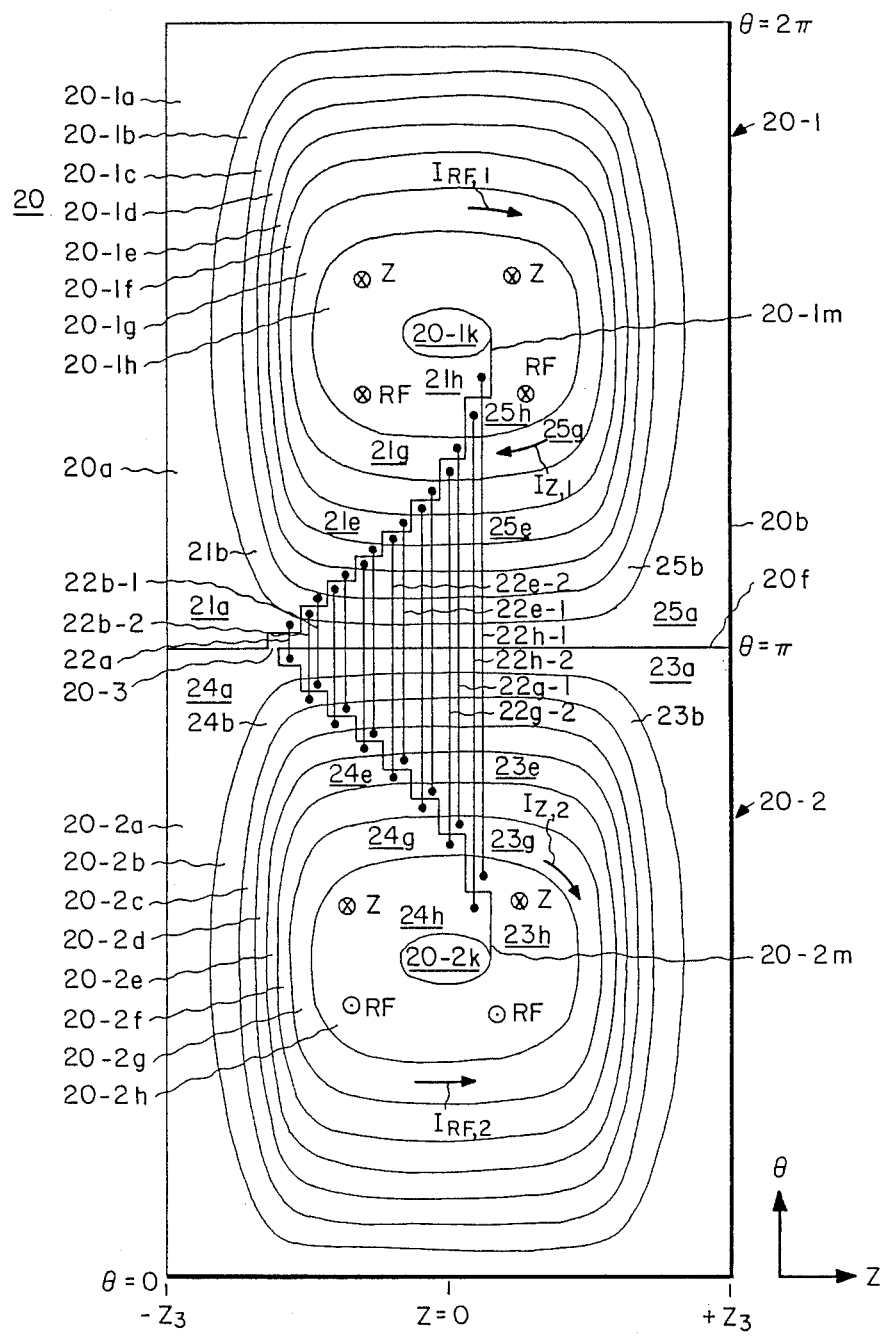
FIG. 3 is a plan view of one embodiment of an RF shield, illustrating the manner in which the contour portion are cut and reconnected to remove Z gradient interaction.

In accordance with the invention, if each conductive loop 10-1i and 10-2i, where a≦i≦h, is properly severed and properly reconnected, with the bottom-portion loop 10-1i and top-portion loop 10-2i in series, the Z-gradient $G_Z$ interaction can be nullified and any attenuation thereof reduced substantially to zero, while the X-gradient and Y-gradient self-cancellations and the RF shielding properties remain substantially unaffected. One presently preferred embodiment of a cut-and-reconnected shield 20 is shown in FIG. 3. Each of conductive open-centered loops 20-1a through 210-1h (but not solid contour 20-1k) in the shield top half 20-1 is cut by a first cut line 20-1m into generally "C"-shaped conductive members. Top cut line 20-1m generally radially extends from central contour portion 20-1k to a first, left-hand shield edge 20a. Each of conductive open-centered loops 20-2a through 20-2h (in bottom half shield 20-2) is cut into other generally C-shaped conductive members by a second cut line 20-2m, which generally radially extends from the center conductive contour portion 20-2k toward edge 20a, until a bridging conductive strip 20-3 is reached; cut line 20-2m then reverses direction and extends towards a second, right-hand shield edge 20b. A first end 21i, where a≦i≦h, of each top contour C-shaped loop 20-1i is connected, via a first conductor 22i-1, to a juxtaposed first end 23i of each bottom C-shaped contour loop 20-2i; the opposite end 24i of that bottom C-shaped loop 20-2i is connected to a remaining top C-shaped loop end 25i by a second conductor 22i-2. Each pair of C-shaped loops is thus effectively connected in series. For example, the first end 21h of the top portion C-shaped loop 20-1h is connected via a first conductive member 22h-1 to a first end 23h of lower C-shaped portion conductive C-shaped loop 20-2h; the opposite, but adjacent, end 24h of that lower portion C-shaped loop is connected, by another conductive member 22h-2 to the remaining end 25h of the top portion C-shaped loop 21-1h. Similarly, the next-inward top portion C-shaped loop 20-1g has a first end 21g connected via a conductive member 22g-1 to an associated first end 23g of the associated bottom-portion C-shaped loop 20-2g, with the adjacent bottom loop second end 24g being connected via another conductive member 22g-2 to the remaining end 25g of the top portion C-shaped loop. Similarly, all intermediate C-shaped loops are so connected; for example, top portion C-shaped loop 20-1e has a first end 21e connected, via conductive member 22e-1 to end 23e of lower portion C-shaped loop 20-2e, having its opposite end 24e connected, via another conductive member 22e-2, to the remaining end 25e of upper-portion conductive C-shaped loop 20-1e. The second-outermost C-shaped loops 21-1b and 21-2b are connected with the pair of conductive members 22b-1 and 22b-2, respectively between ends 21b/23b and 24b/25b, and so forth. Each pair of C-shaped conductive members 22h-1/22h-2, 22g-1/22g-2, . . . , 22b-1/22b-2 lie substantially parallel to one another, so that the currents flowing in opposite directions therethrough provide essentially cancelling magnetic fields. The outermost C-shaped loops 20-1a and 20-2a may appear to be connected by only a single connective member 22a, between upper-portion loop first end 21a and lower-portion loop 23a, but in fact have a second interloop connection, as the remaining loop ends 24a and 25a are integrally connected by bridging conductive portion 20-3, which is not only close to conductive members 22a, but also has a current flow therethrough substantially parallel to the current flow in conductive member 22a.

The RF-induced shield currents $I_{RF,1}$ flow clockwise in the upper-portion loops, e.g. in loop 20-1g, exit from the second loop end, e.g. end 25g, and flow through the associated conductive member, e.g. 22g-2, to the associated end, e.g. end 24g, of the lower portion associated loop, e.g. loop 20-2g. The RF-induced current $I_{RF,2}$ in that lower-portion loop is flowing in the same direction as the current source into loop end 24g, so that the RF induced currents add in series, with the total current leaving the remaining loop end 25g, flowing through the remaining conductive member 22g-1, and into the first end, e.g. end 21g, of the upper-portion loop. Conversely, the Z gradient-induced current $I_{Z,1}$ in the top portion flows from upper loop second end 25g, through connecting member 22g-2, into lower-portion loop end 24g, where the oppositely-directed Z gradient-induced current $I_{Z,2}$ flows in the opposite direction, and, having substantially the same magnitude, cancels that current. Thus, there is substantially no Z gradient interaction, while the RF shielding connectivity is retained. It will be understood that while shield 20 is shown with contour loops 20-1/20-2 all carrying substantially equal contour currents, equal current conditions are not necessary and any reasonable set of contour spacings should work equally well. Similarly, it will be understood that the exact number of contours is not critical, as long as the area of each conductive loop 20-1i/20-1i is relatively small, with respect to the entire shield area. It is also highly desirable that the currents induced in the loop conductive areas should have short time constants and cause associated fields to have small spatial extent and not penetrate into the volume defined by the RF coil 11, when the RF coil is within the RF shield. Likewise, it will be understood that to shield an RF whole body coil operating in the quadrature mode, with a rotating magnetic field $B_1$, a pair of shields 20, with their axes are right angles to one another, are utilized in place of the single shield 20.

Referring now to FIG. 4, another presently preferred RF shield embodiment 22 is formed from the same-size single conductive sheet as shield 20, and has contours 22-1 although 22-1h and 22-1k in a top half portion 22a and contours 22-2a through 22-2h/22-2k in a bottom half-portion 22b. The cut lines defining each of somewhat C-shaped contour portions 22-1i/22-2i, for $a \leq i \leq h$, are not complete, but have a commonly positioned set of discontinuities to form web portions 22w-1 and 22w-2. The web portions here are positioned substantially between solid contour portions 22-1k and 22-2k, and approximately equidistant from the shield edges 22c/22d. The continuous web breaks the midline 22f into two separated cut lines 22f-1 and 22f-2. Thus, each of loop contour portions 22-1a through 22-1h and 22-2a through 22-2h has a first end 22-1s-1 through 22-h1 and 22-2s1 through 22-2h1 and 22-2m; all respective loop contour portion second ends 22-1a2 through 22-1h2 and 22-2a2 through 22-2h2 integrally extend into one of web portions 22w-1 and 22w-2. The separate first ends of the same associated loop contours are connected together by an associated conductive member 22i ($a \leq i \leq h$), which are all located to be parallel to web portions 22w; thus, upper-half C-shaped loop contour first end 22-1h1 is connected via conductive member 22h to lower-half C-shaped contour first end 22-2h1, and so forth. Gradient-induced current (e.g. current $I_{z,1}$ in the upper-half G loop) in one half of the shield is negated by a gradient-induced current (e.g. current $I_{z,2}$ in the lower-half G loop) in the other shield half. RF-induced currents is one shield half (e.g. current $I_{RF,1}$ in the upper-half G loop) flow out of the loop first end (e.g. end 22-1g) and through the associated conductive member (e.g. member 22g) into the first end of the other half-shield (e.g. end 22-2g1) and add to the RF current induced in the other-half shield loop (e.g. $I_{RF,2}$ in the lower-half G loop); the total current flow is directed back through the web portions, to the first half of the shield, providing an effective RF short-circuit for maximum RF shielding. Note that the web portions 22w are at a single potential and can be effectively tied to a common (ground) potential, so that the shield can also act as an electrostatic shield.

Referring now to FIG. 5, our presently most preferred RF shield embodiment 24 is also formed of a similar-sized single conductive sheet, with similar streamline-contour-shaped portions (loop contour portions 24-1a through 24-1h and solid contour portion 24-1k) in the upper shield half 24a and in the lower shield half 24b (loop contour portions 24-2a through 24-2h and solid contour portion 24-2k). The radial cut lines in each shield half are linear extensions of one another, so that a single cut line 24m runs from one of the solid portions 24-1k to the other solid portion 24-2k; cut line 24m is preferable substantially parallel to edges 24c and 24d and substantially equidistant therebetween. Cut line 24m breaks each loop contour into a generally C-shaped member. The juxtaposed first and second ends of each C-shaped loop are then electrically connected, or bridged, with an associated one of RF capacitances 25-1a through 25-1h and 25-2a through 25-2h. Each capacitor 25 has a reactance which is small at the RF frequency involved, compared to the inductive reactance of the associated loop contour portion, but has a very large reactance at the audio frequencies characterizing the gradient waveforms, to prevent induction of significant currents by the gradient fields.

While several presently preferred embodiments of the present invention are presented herein by way of explanation and illustration, many variations and modifications will now occur to those skilled in the art. It is our intent, therefore, to be limited only by the scope of the appended claims and not by the specific details and instrumentalities presented by way of explanation herein.

What we claim is:

1. A radio-frequency (RF) shield, for use interposed between a set of gradient coils, located beyond the RF shield, and at least one RF coil, located within the RF shield, in an NMR imaging device, comprises:

a single conductive sheet formed into a cylinder of generally circular cross-section and having opposed first and second half-cylinders each with at least a plurality of conductive streamline loop portions each defined by at least one nonconductive cut line etched through the sheet, between each pair of adjacent portions and parallel to RF current flow induced therein; each half-cylinder having a radial cut line separating each loop portion thereof into a generally C-shaped conductive loop portion; and means for interconnecting ends of the C-shaped portions to provide a set of essentially short circuits for any RF current induced in the shield by the field of the at least one RF coil, while passing any field from said gradient coil set in substantially unattenuated manner.

2. The RF shield of claim 1, wherein each cut line is at an angle with respect to a shield end plane.

3. The RF shield of claim 2, wherein the cut line in each half-cylinder is directed toward a different shield end plane.

4. The RF shield of claim 3, wherein the cut lines form step-like ends in at least one of the C-shaped loop portions.

5. The RF shield of claim 1, wherein the cut line in each half-cylinder is substantially parallel to an end plane of the shield.

6. The RF shield of claim 5, wherein the sheet further includes a web portion to which is integrally joined one end of each C-shaped loop portion.

7. The RF shield of claim 1, wherein the interconnecting means includes a reactive element connected between juxtaposed ends of each C-shaped loop portion.

8. The RF shield of claim 7, wherein the reactive element is a capacitor.

9. The RF shield of claim 8, wherein the capacitor has a relative low impedance at the RF frequency and relatively high impedance at a highest operating frequency of the gradient coil set.

10. The RF shield of claim 1, wherein like-positioned ends of each of a pair of C-shaped loop portions similarly-positioned in opposite half-cylinders are connected by conductive wire members.

11. The RF shield of claim 10, wherein the conductive wire members joined to the ends of each loop portion are substantially parallel to one another.

12. The RF shield of claim 10, wherein one end of an outer-most loop portion of each half-cylinder is integrally joined to an adjacent end of an outer-most loop portion of the other half cylinder by a bridging portion of the sheet, and the other ends of each outer-most loop portion are joined by a conductive wire member.

* * * * *